(12) United States Patent
Smith

(10) Patent No.: US 7,027,275 B2
(45) Date of Patent: Apr. 11, 2006

(54) ELECTROSTATIC DISCHARGE PROTECTION CIRCUIT WITH FEEDBACK ENHANCED TRIGGERING

(75) Inventor: Jeremy C. Smith, Austin, TX (US)

(73) Assignee: Texas Instruments Incorporated, Dallas, TX (US)

(*) Notice: Subject to any disclaimer, the term of this patent is extended or adjusted under 35 U.S.C. 154(b) by 272 days.

(21) Appl. No.: 10/340,268

(22) Filed: Jan. 10, 2003

(65) Prior Publication Data

US 2004/0136126 A1    Jul. 15, 2004

(51) Int. Cl.
*H02H 9/00*    (2006.01)

(52) U.S. Cl. .................................. 361/56; 327/374
(58) Field of Classification Search ............ 361/111, 361/56, 58; 327/374, 166
See application file for complete search history.

(56) References Cited

U.S. PATENT DOCUMENTS

| | | | |
|---|---|---|---|
| 5,440,162 A | | 8/1995 | Worley et al. |
| 5,559,659 A | * | 9/1996 | Strauss ........................ 361/56 |
| 5,907,464 A | | 5/1999 | Maloney et al. |
| 5,946,177 A | | 8/1999 | Miller et al. |
| 5,956,219 A | | 9/1999 | Maloney |
| 6,552,886 B1 | * | 4/2003 | Wu et al. ...................... 361/56 |

OTHER PUBLICATIONS

Richard Merrill, et al., "ESD Design Methodology" Proc. EOS/ESD Symp., EOS-15, 1993, pp. 233-237.
E.R. Worley, et al., "Sub-Micron Chip ESD Protection Schemes Which Avoid Avalanching Junctions" EOS/ESD Symposium Proceedings, 1995, pp. 13-20.
Cynthia A. Torres, et al., "Modular, Portable, and Easily Simulated ESD Protection Networks for Advanced CMOS Technologies" EOS/ESD Symposium, 2001, pp. 82-95.

* cited by examiner

*Primary Examiner*—Stephen W. Jackson
*Assistant Examiner*—Boris Benenson
(74) *Attorney, Agent, or Firm*—Alan K. Stewart; W. James Brady, III; Frederick J. Telecky, Jr.

(57) ABSTRACT

A feedback enhanced triggering device for an electrostatic discharge protection circuit includes: a first inverter 30b having an output coupled to an input of a second inverter 30c, the second inverter 30c having an output coupled to a control node for a discharge device 31 such as a transistor; a high side feedback transistor 34 coupled to the output of the first inverter 30b, and having a control node coupled to the output of the second inverter 30c; and a low side feedback transistor 35 coupled to the output of the first inverter 30b, and having a control node coupled to the output of the second inverter 30c, wherein the feedback transistors 34 and 35 provide enhanced triggering for electrostatic discharge protection.

18 Claims, 6 Drawing Sheets

ELECTROSTATIC DISCHARGE PROTECTION CIRCUIT WITH FEEDBACK ENHANCED TRIGGERING

FIELD OF THE INVENTION

This invention generally relates to electronic systems and in particular it relates to electrostatic discharge protection circuits.

BACKGROUND OF THE INVENTION

FIG. 1 depicts a circuit diagram of a portion of an electrostatic discharge (ESD) protection circuit 10 that contains an Input/Output (I/O) pad 20. The I/O pad 20 further contains bondpad 24, diodes 25 and 26, and MOSFETS 27 and 28. Within this specification the first current electrode of MOSFET devices is called the source terminal, which is coupled to one of the power supply terminals VDD or VSS unless otherwise specified. The second current electrode of those same MOSFET devices is called the drain terminal. The drain terminal of MOSFET 28 is coupled to bondpad 24, as is the drain terminal of MOSFET 27. In I/O pad 20, the anode of diode 26 is coupled to bondpad 24 and the cathode of diode 26 is coupled to supply terminal VDD. Similarly, the cathode of diode 25 is coupled to the bondpad 24 and the anode of diode 25 coupled to terminal VSS. The ESD protection circuit 10 further contains a rail clamp 30 with a first current electrode coupled to supply terminal VDD and a second current electrode coupled supply terminal VSS. ESD protection circuit 10 also contains a diode 40 where the anode of diode 40 is coupled to supply rail VSS and the cathode of diode 40 is coupled to supply terminal VDD. The ESD protection circuit 10 also contains parasitic bus resistances RP and RG in the supply lines. These are not explicit resistor elements, but rather ones that exist by default due to the inherent resistance of any electrical conductor. In general, the greater the distance between the I/O pad 20 and the ESD rail clamp 30 and bus diode 40, the greater the value of the parasitic resistances RP and RG.

Integrated circuits must be protected against electrostatic discharges in order to prevent permanent damage that can impair or eliminate desired functionality. ESD damage normally occurs in the MOSFET devices or interconnecting layers used to couple MOSFETs together to form a circuit. Each pin in an integrated circuit must be coupled to an appropriate ESD protection circuit such that the ESD discharge current is shunted away from the internal portions of the chip that are the most sensitive to damage. As such, ESD discharge paths must be provided between every pair of pins in an IC for both positive and negative polarities.

The function of diode 26 in FIG. 1 is to provide a shunting path to the rail VDD for ESD currents produced by ESD potentials applied to bondpad 24 which are significantly more positive than anywhere else on the IC. Similarly, the function of diode 25 is to provide a shunting path for ESD currents that are produced by ESD potentials that are significantly more negative than elsewhere on the IC. The function of rail clamp 30 is to provide a coupling between the rails VDD and VSS for those ESD paths that require such a coupling in order to complete the discharge loop. For example, for pad positive-to-VSS stress, where bondpad 24 is taken positive with respect to the rail VSS, the ESD discharge current 100 flows from bondpad 24, through diode 26, along the rail VDD (through the parasitic resistor RP) and back to the rail VSS through rail clamp 30. In general, the goal is to keep the maximum voltage built-up in the discharge loop to within acceptable limits. Similarly, for pad positive-to-VDD, where the bondpad 24 is taken positive relative to the rail VDD, discharge current 102 flows from bondpad 24, through diode 26 and to the rail VDD where the circuit is completed.

For negative ESD events applied to bondpad 24 such as pad negative-to-VSS stress, ESD current 101 flows from the rail VSS (which is now positive relative to the bondpad 24) through diode 25 and back to bondpad 24 where the circuit is completed. Finally, for pad negative-to-VDD, the ESD current 103 flows from the rail VDD, through rail clamp 30, along the rail VSS (through parasitic resistance RG) and back to bondpad 24 through diode 25. Again, the goal is to keep the maximum voltage built-up in the discharge loop to within acceptable limits. In each case described so far, diode 25 or 26 alone or a combination of diode 25 or 26 and rail clamp 30, act to provide a shunting path for the ESD current such that these currents are kept from the sensitive internal portions of the chip. For ESD stress applied to bondpad 24, output buffer transistors 27 and 28 are the most susceptible to damage and so is any other input buffer circuitry (not shown) coupled to bondpad 24.

Just as ESD pulses can be applied between the I/O pads and the supply rails, ESD discharges can occur between the power supply rails. For example for rail VDD positive-to-VSS stress, ESD current 104 flows through the rail clamp 30 from the rail VDD to the rail VSS. For rail VSS positive-to-VDD stress, ESD current 105 flows from the rail VSS, through diode 40 and to the rail VDD. Thus, the rail clamp circuit is a fundamental component in providing a discharge path for ESD polarities (positive or negative) which cause the first current electrode of the rail clamp to be more positive than its second current electrode. Although the several ESD discharge paths shown in FIG. 1, there are other paths not shown between other pairs of pins which are well known to one skilled in the art. These have not been described here simply for brevity and do not detract in any way from the description or understanding of the invention described herein.

ESD discharges are brief transient events that are usually less than one microsecond in duration. Furthermore, the rise times associated with these brief pulses are usually less than roughly twenty nanoseconds. When ESD pulses are applied to the I/O pads of a chip, they produce similar brief, fast rise time potentials on the power supply rails due to the presence of ESD protection diodes 25 and 26 in FIG. 1. Thus, the rail clamp circuit must be able to detect these fast transients and begin conducting so as to shunt the resulting ESD current. However, the rail clamp must not respond to the much slower rise times (greater than 1 millisecond) which are present on the power supply rails during normal power-up events in regular chip operation. If the ESD rail clamp were to trigger and conduct during normal power-up events, the desired operation of the IC could be compromised. Furthermore, in addition to triggering when needed for ESD protection, the rail clamp circuits must stay in a highly conductive state for the entire duration of the ESD pulse so that all of the ESD energy is safely discharged. If the rail clamp circuit were to shut-off prematurely, damaging potentials would build-up quickly between the power rails and cause device failure.

FIG. 2 depicts a wider portion of an integrated circuit that shows how rail clamp 30 can be placed relative to the I/O pads it is protecting. Here, rail clamp 30 has been placed in the VSS pads in the chip that are responsible for supplying power connections for the IC. The rail clamp 30 can also be placed in VDD pads. These placements are shown as 30L1 and 30R1. In this manner, many I/O cells (20L2, 20L1, 20, 20R1, 20R2) are able to share ESD rail clamp 30L1 and 30R1 that results in more robust ESD protection and reduced chip area. Alternatively, the size of an individual rail clamp can be reduced if more than one can be relied upon to conduct ESD current that also saves die area. In general, the sum total of parasitic power and ground rail resistances (RPL2, RPL1 RP RPR1, RPR2) and (RGL2, RGL1 RG RGR1, RGR2) around the ESD discharge loop sets the limit on how far apart ESD rail clamps can be spaced in order to achieve a given level of ESD protection. The overall goal is to keep the maximum voltage that occurs at the bondpad during an ESD discharge within acceptable limits so that damage does not occur in the sensitive circuit elements.

In an effort to mitigate the effects of parasitic bus resistance, one may distribute the ESD rail clamps locally in the I/O cells themselves (20BL1, 20B, 20BR1). This is shown in FIG. 3 where several smaller local clamps are used where one is placed in each I/O pad. In this manner, several ESD rail clamps must now participate in the ESD event to achieve robust protection but the effects of power and ground rail resistances may be reduced over locating the larger clamps in more centralized locations. In general one skilled in the art is able to make a determination as to whether the scheme described in FIG. 3 or in FIG. 2 is more applicable to their particular application. This in no way limits the general usage of the ESD rail clamp described herein, as one skilled in the art is able to easily scale the relative sizes of the clamp so that an optimal tradeoff is achieved.

SUMMARY OF THE INVENTION

A feedback enhanced triggering device for an electrostatic discharge protection circuit includes: a first inverter having an output coupled to an input of a second inverter; the second inverter having an output coupled to a control node for a discharge device such as a transistor; a high side feedback transistor coupled to the output of the first inverter, and having a control node coupled to the output of the second inverter; and a low side feedback transistor coupled to the output of the first inverter, and having a control node coupled to the output of the second inverter, wherein the feedback transistors provide enhanced triggering for electrostatic discharge protection.

DETAILED DESCRIPTION OF PREFERRED EMBODIMENTS

Figure 4:
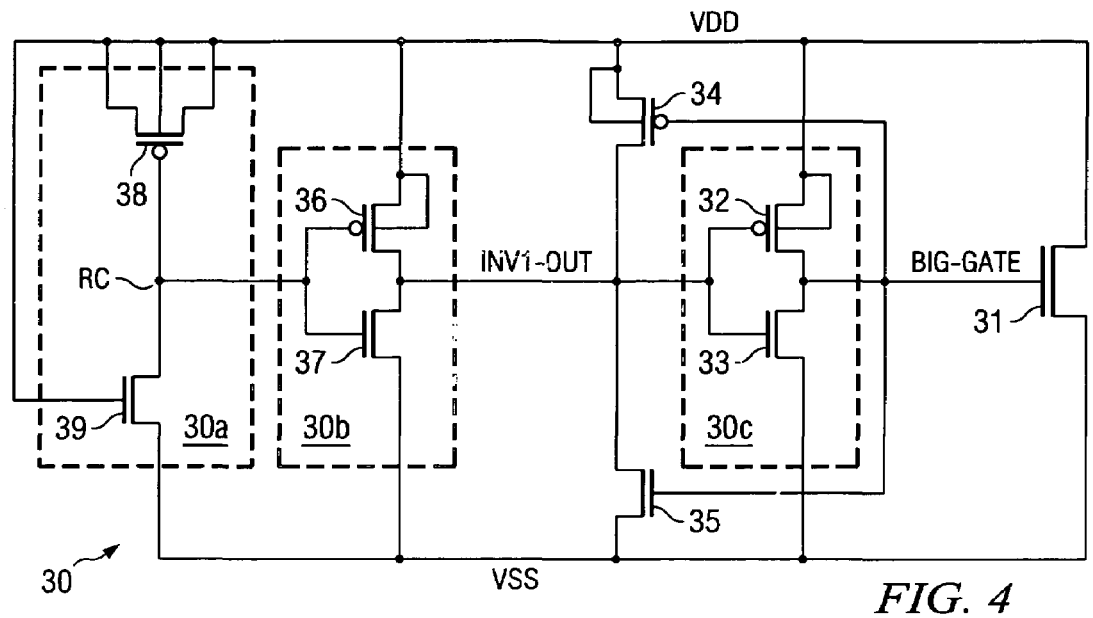
FIG. 4 is a schematic circuit diagram of an ESD protection circuit with feedback enhanced triggering according to the present invention.

FIG. 4 depicts a schematic diagram of the rail clamp circuit of this invention. The circuit is comprised of an RC circuit 30a (timing circuit), a first inverter circuit 30b (CMOS inverter), a second inverter circuit 30c (CMOS inverter), an ESD transistor 31 (ESD device), a feedback NMOS device 35 and a feedback PMOS device 34. The RC circuit 30a, is further comprised of PMOS transistor 38 that functions as a capacitor and NMOS transistor 39 which functions as a resistor. PMOS transistor 38 has its first and second current electrodes, and its well electrode coupled to the VDD supply rail. The control electrode of transistor 38 is coupled to node RC. The NMOS transistor 39 has its source electrode coupled to the VSS rail and its drain electrode coupled to node RC. The control electrode of transistor 39 is coupled to the node VDD. Inverter 30b is comprised of PMOS transistor 36 and NMOS transistor 37. PMOS transistor 36 has its source and well terminal coupled to the rail VDD, its drain terminal coupled to node INV1-OUT and its control electrode coupled to node RC. NMOS transistor 37 has its source electrode coupled to node VSS, its drain electrode coupled to node INV-OUT1 and its control electrode coupled to node RC. Similarly, Inverter 30c is comprised of PMOS transistor 32 and NMOS transistor 33. PMOS transistor 32 has its source and well terminal coupled to the rail VDD, its drain terminal coupled to node BIG-GATE and its control electrode coupled to node INV1-OUT. NMOS transistor 33 has its source electrode coupled to node VSS, its drain electrode coupled to node BIG-GATE and its control electrode coupled to node INV1-OUT. ESD discharge transistor 31 has its drain terminal coupled to the rail VDD, its source terminal coupled to the rail VSS, and its control electrode coupled to node BIG-GATE. PMOS feedback transistor 34 has its source and well terminals coupled to the rail VDD and its drain terminal coupled to node INV1-OUT. The control electrode of transistor 34 is coupled to node BIG-GATE. Finally, NMOS feedback transistor 35 has its source electrode coupled to the rail VSS, its drain electrode coupled to node INV1_OUT and its control electrode coupled to node BIG-GATE.

The operation of the circuit shown in FIG. 4 under ESD conditions will now be described. Prior to the ESD event, the integrated circuit is not energized and all node voltages can be considered at zero potential. A fast positive going ESD transient on the power rail, causes node RC to rise instantaneously along with the VDD potential due to the displacement current flow in the MOSFET capacitor 38. The elevation of node RC causes transistor 37 to be placed into a conductive state which in turn pulls the node INV1-OUT towards the ground potential VSS. This in turn causes transistor 32 to be placed into a conductive state which then couples the control electrode of ESD discharge transistor 31 towards the VDD potential. Thus, transistor 31 is now placed in a conductive state and is now free to begin to shunt the ESD current. Once the potential of node BIG-GATE has risen to a threshold potential above the rail VSS, NMOS feedback transistor 35 begins to conduct. Current conduction in transistor 35 further pulls the potential of node INV1-OUT towards ground, which further enhances current conduction in transistor 32, which then pulls the potential of BIG-GATE closer to that of the rail VDD. In the limit, the potential of node INV1_OUT is at ground VSS and the potential of node BIG-GATE is identical to that of the rail VDD which ensures that ESD discharge transistor 31 is conducting as strongly as possible. This completes a feedback loop, which "latches" transistor 31 into a conductive state.

Once transistor 31 has been latched into a conductive state, the time constant of the RC circuit 30a is now free to time out. This is highly desirable since this means that the duration of this time constant can be significantly shorter than the ESD event which translates into an RC network with greatly reduced physical area. While the rail clamp circuit is transitioning into this conductive state, PMOS feedback transistor 34 will actually impede the collapse on node INV1-OUT to ground, as long as the potential of node BIG-GATE is near ground prior to the full turn-on of transistor 31. This is actually a highly desirable effect since it functions as a mechanism by which to prevent false triggering. As the potential on node BIG-GATE begins to rise, transistor 34 begins to shut-off which then accelerates the collapse of node INV1-OUT which in turn elevates node BIG-GATE via enhanced conduction in transistor 32. One skilled in the art can adjust the dynamic current balance of transistor 37, transistor 34, and feedback transistor 35 to achieve a minimum critical voltage needed on the rail VDD to trigger the rail clamp once the transient change on the rail VDD has caused the initial action. This is a highly novel and desirable effect since false triggering can be controlled.

The timing out of RC circuit 30a means that NMOS resistor 39 has had enough time to discharge the potential on node RC towards ground VSS. This in turn causes PMOS device 36 to begin to conduct. This action now tries to elevate the potential of node INV1-OUT towards the rail VDD which conversely attempts to turn-off the clamp. The potential on node INV1-OUT is set by the current balance between transistor 36 and transistor 35. The settling potential of this node is set such that the clamp stays on until a minimum critical residual energy is reached in the ESD pulse. Once the energy in the ESD pulse has reached this critical point, the latching action of the circuit will release and transistor 31 will again be placed into a non-conductive state. By this time, the ESD pulse has either dissipated or does not have sufficient energy to cause damage to the integrated circuit.

Figure 5:
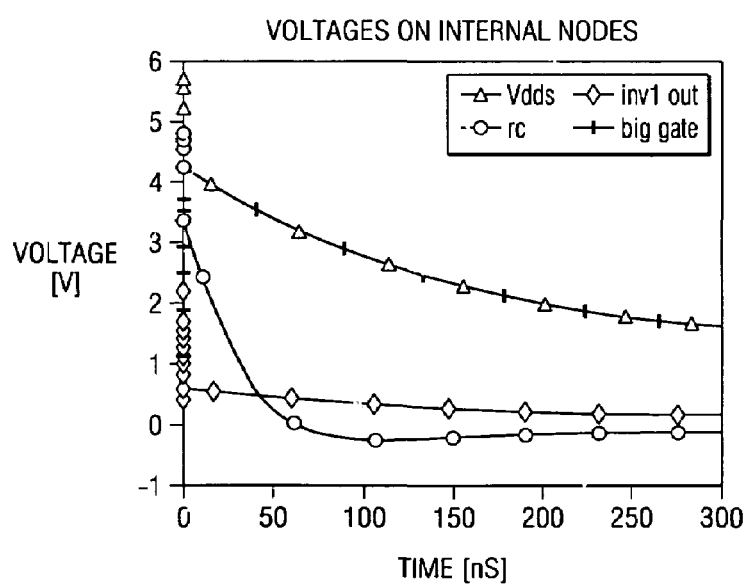
FIG. 5 is a plot of the internal node voltages in the circuit of FIG. 4 during a 4 kV Human Body Model (HBM) ESD discharge.

FIG. 5 depicts a SPICE simulation of the internal node voltages in rail clamp 30 during a 4 kV Human Body Model (HBM) ESD discharge. Here a positive-to-VSS HBM pulse is applied between the VDD and VSS terminals of the circuit. In FIG. 5, the potential of node RC is shown to instantaneously respond to the quick rise of the VDD rail and later, after some time, release back to its resting value. This is the triggering and time-out of the RC circuit 30a. Similarly, node INV1-OUT is shown to initially drop to and remain at a potential near ground. As stated previously, initial coupling to ground of node INV1-OUT is caused by turn-on of transistor 37 and the subsequent holding of node INV1-OUT at ground (after RC timeout) results from feedback NMOS transistor 35. Node BIG-GATE is shown to be coupled to the rail VDD which results in ESD discharge transistor 31 being placed in a highly conductive state.

Figure 6:
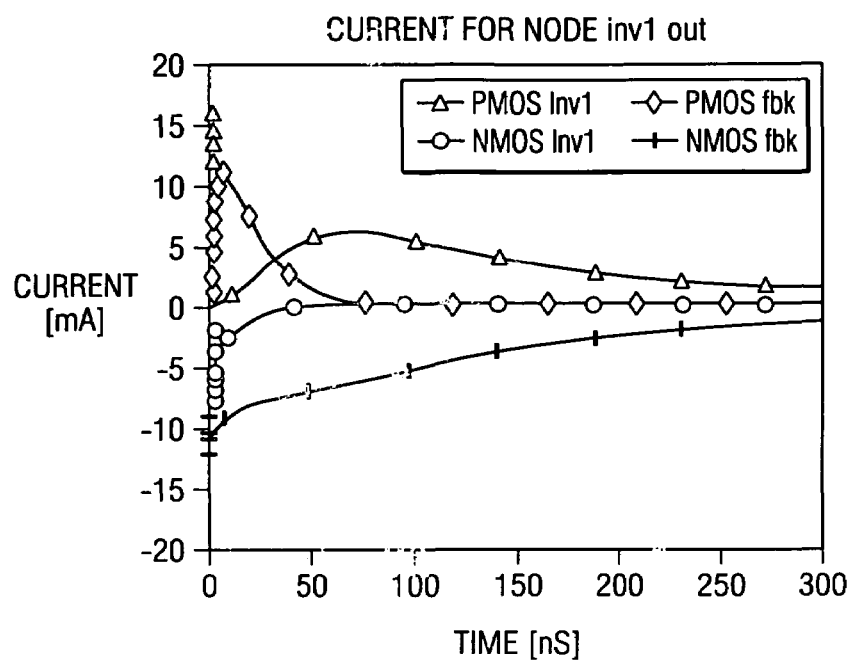
FIG. 6 is a plot of individual transistor currents in the circuit of FIG. 4 during an ESD discharge.

FIG. 6 shows the individual transistor currents in device 36 and 37 of Inverter 1 (30b) and feedback NMOS transistor 35 and feedback PMOS transistor 34. The aggregate effect of these currents determines the voltage profile exhibited by node INV1-OUT. FIG. 6 shows transistor 37 as initially conducting current due to turn-on caused by node RC and current flow in transistor 36 being essentially zero. Once the RC time constant begins to turn-off, current flow in transistor 37 diminishes while current flow in transistor 36 increases and remains present for the majority of the ESD event. Similarly, current flow in NMOS feedback device 35 begins instantly as does that in PMOS feedback device 34. However, the current flow in transistor 34 soon disappears due to the charging of node BIG-GATE. Thus the maintenance of the voltage of node INV1-OUT over the remainder of the ESD pulse is due to the current balance between transistor 36 and 35.

Figure 1:
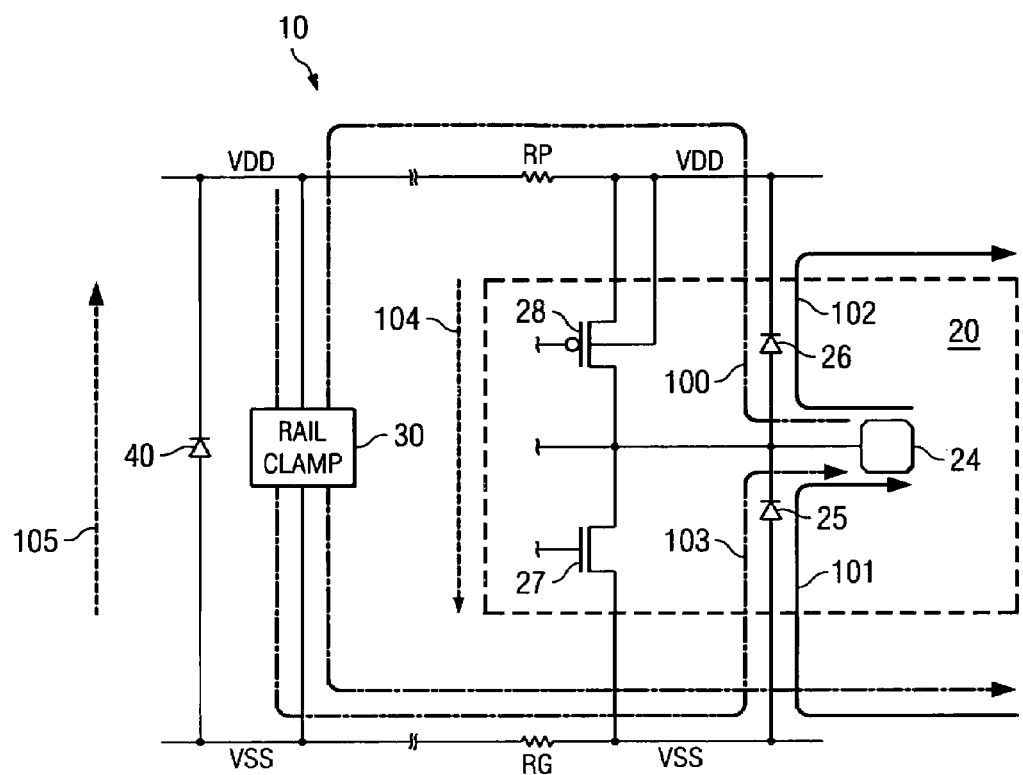
FIG. 1 is a schematic circuit diagram of a portion of an electrostatic discharge (ESD) protection circuit.
Figure 3:
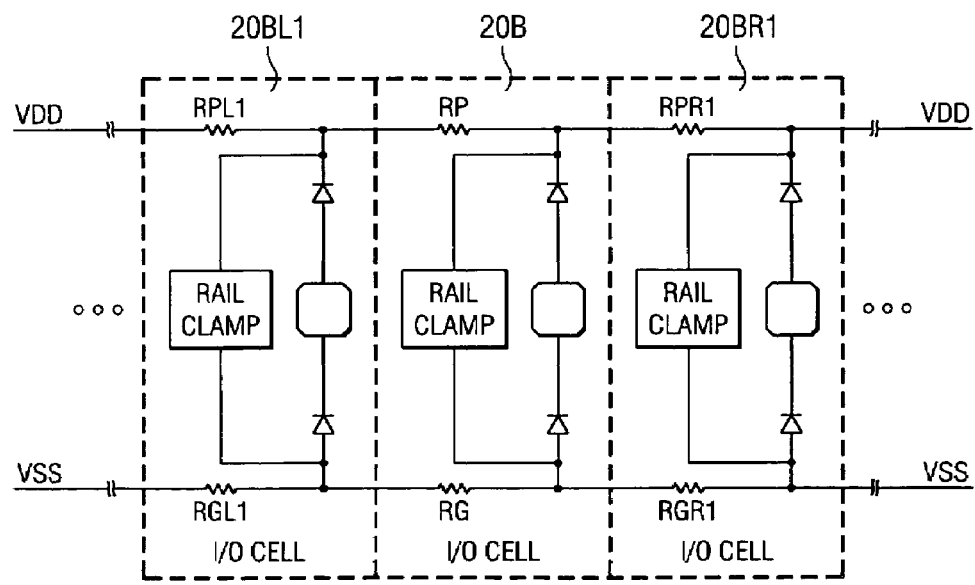
FIG. 3 is a schematic circuit diagram of a portion of an integrated circuit that shows the ESD protection circuits placed locally in the I/O cells.
Figure 2:
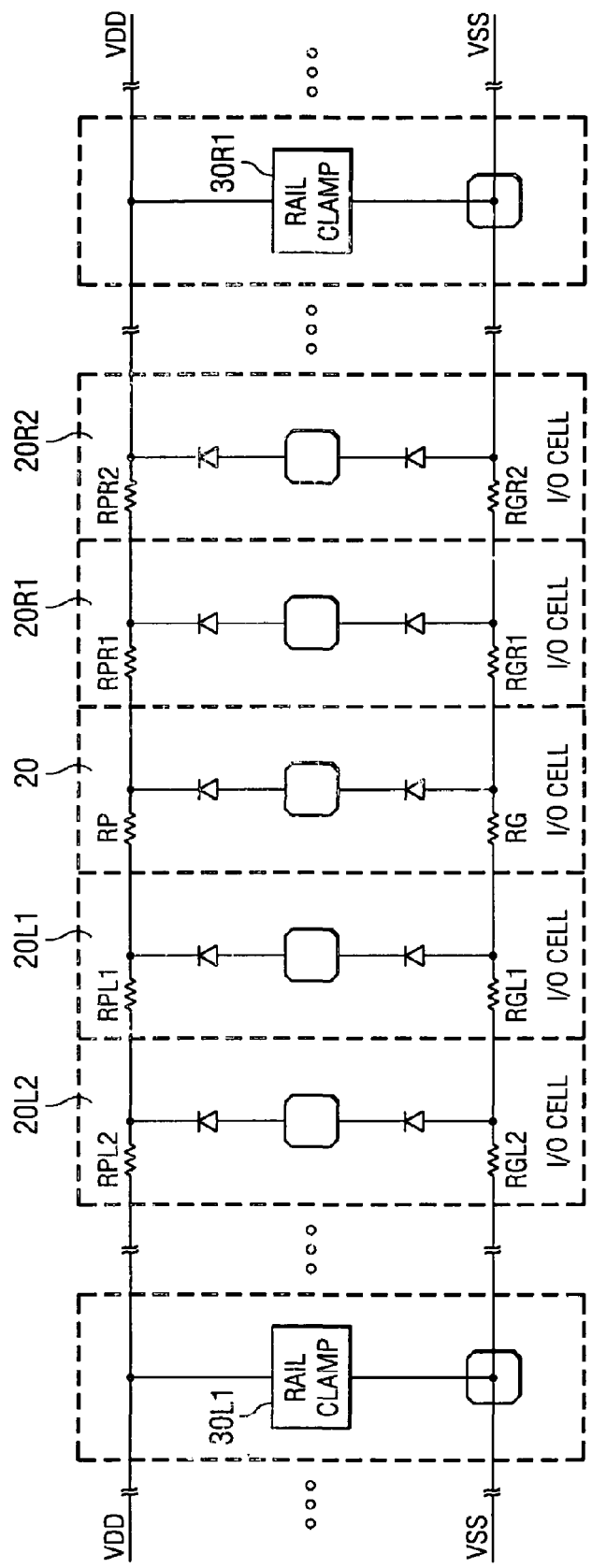
FIG. 2 is a schematic circuit diagram of a portion of an integrated circuit that shows the placement of ESD protection circuits relative to the I/O pads that are protected.
Figure 7:
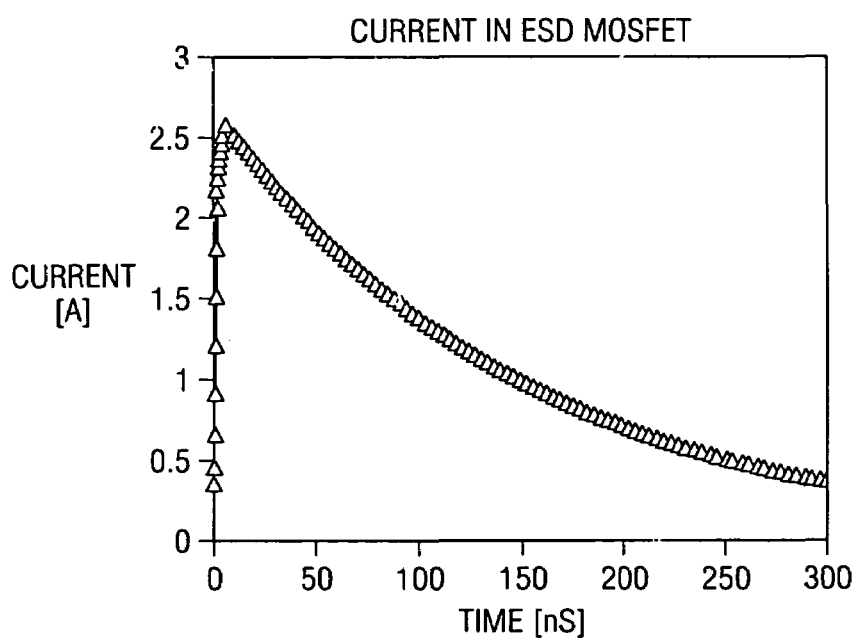
FIG. 7 is a plot of the current in the ESD discharge transistor of FIG. 4 during an ESD discharge.

FIG. 7 depicts the current flow between the two current electrodes of ESD discharge transistor 31. It can be seen here that transistor 31 conducts a large (2.6 Amp) ESD current. This necessitates that transistor be a relatively large device to conduct this magnitude of current. Typically, transistor 31 is in the range of 1000 um to 3000 um in total width depending on the number of rail clamps, which are expected to participate in the ESD event in accordance with FIG. 2. If smaller local clamps are used as in the case in FIG. 3, then less total width can be used for each individual clamp 30. One skilled in the art will be able to determine the optimal sizing of rail clamp 30 for a given application and usage.

In general it is important that the ESD rail clamp remain in a non-conductive state during system power-up and normal operation. In normal applications during power-up, the system power supply will ramp at a predefined rate, which is usually in the range of several milliseconds to several tens of milliseconds. This is orders of magnitude slower than the rise times seen during ESD events. As before, we will assume that the chip is unpowered and that all internal node voltages are at essentially zero volts. In response to the slowly increasing voltage rate on the rail VDD, the RC node in FIG. 4 remains at a potential near ground since the NMOS resistor 39 can effectively remove any displacement charge deposited by PMOS capacitor 38. This displacement current is minimal since the dV/dT of the power rail is low. If node RC remains near ground then node INV1-OUT remains at the instantaneous potential of the rail VDD via current conduction in transistor 36. Since the node INV1-OUT is essentially at the potential of the rail VDD, node BIG-GATE is coupled to ground VSS due to current conduction in transistor 33. This maintains ESD discharge transistor 31 in a non-conductive state. Feedback transistor 34 will also be in a conductive state which further couples node INV1-OUT to the rail VDD which is highly beneficial. It will be shown next that feedback transistor 34 has an important role to play in preventing false triggering.

Figure 8:
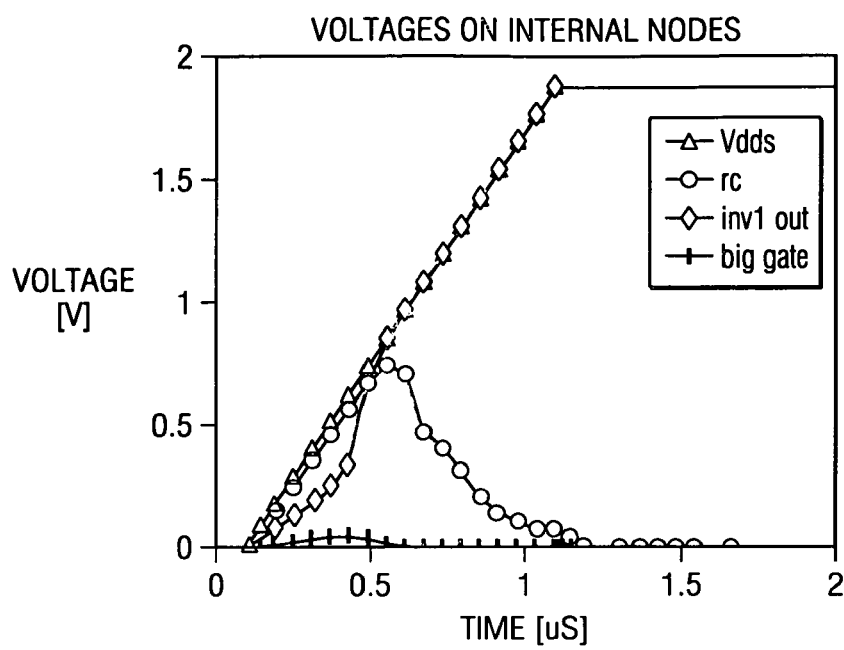
FIG. 8 is a plot of the internal node voltages in the circuit of FIG. 4 during power up and normal operation.
Figure 9:
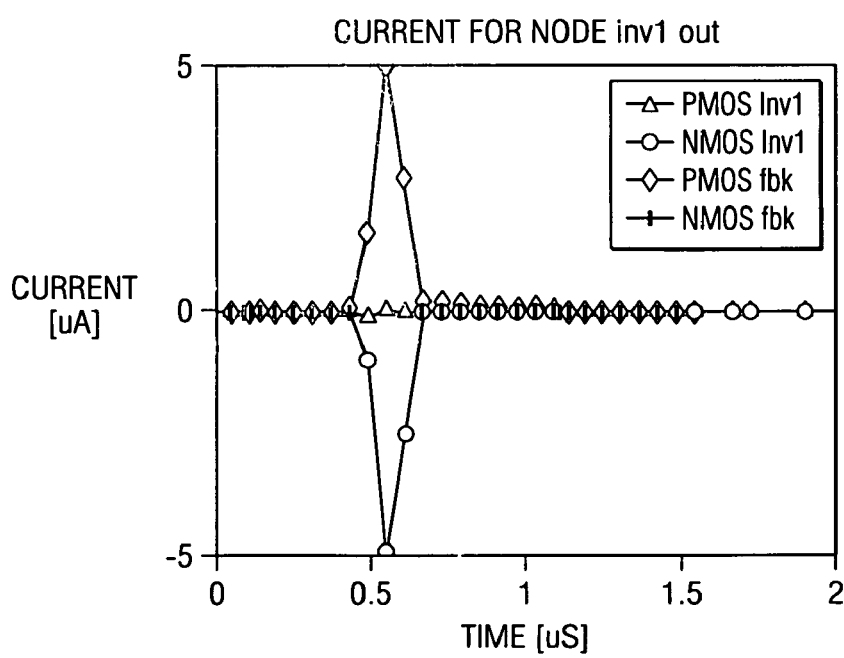
FIG. 9 is a plot of individual transistor currents in the circuit of FIG. 4 during power up and normal operation.
Figure 10:
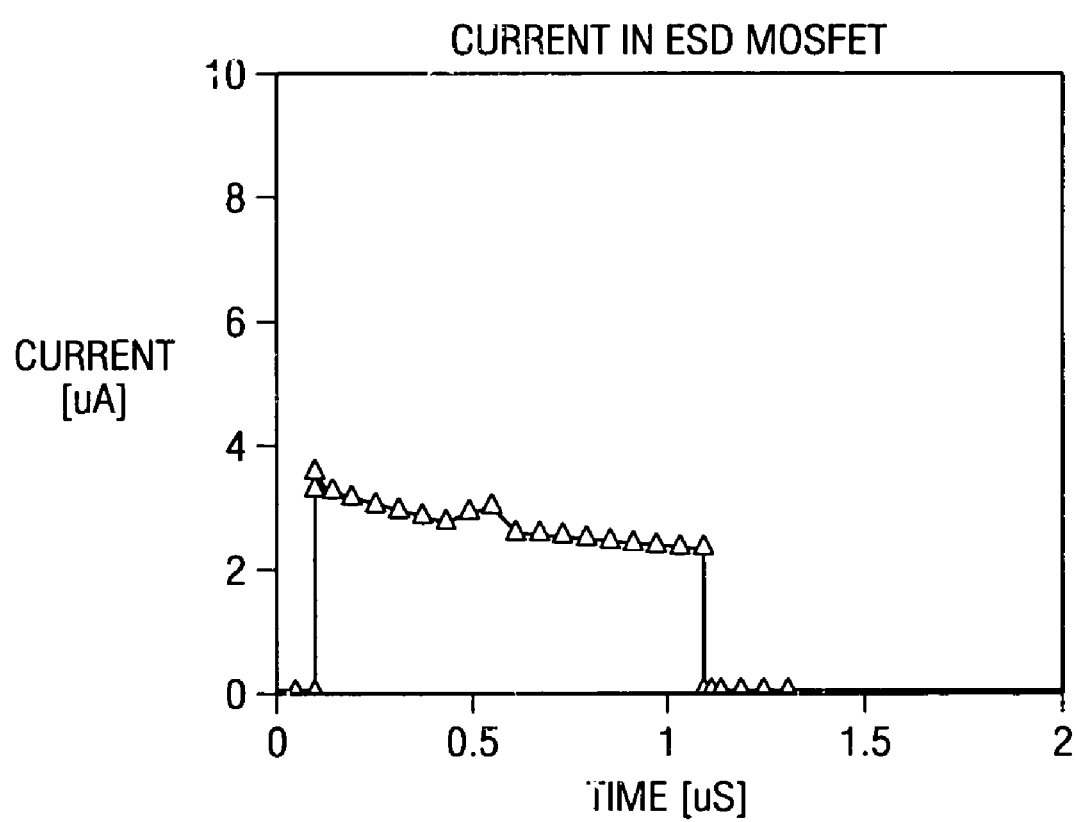
FIG. 10 is a plot of the current in the ESD discharge transistor of FIG. 4 during power up and normal operation.

While most system power supplies ramp in a highly controlled and deterministic manner, there are certain applications where faster than normal power supply transitions occur. One such example is where a system board must be "hot plugged" where it is not practical to power down the entire system. In this case, the transient that results to the individual chip power supplies on the board can be significantly faster than normal. The ESD protection network must not respond to this transient. This can be seen in FIG. 8 where a very fast power supply ramp time of 1 microsecond is applied. Here node RC is elevated to a potential of roughly 0.75V, which is enough to initiate current conduction in transistor 37. This momentarily stalls the rise of node INV1-OUT. Recall that if node INV1-OUT is allowed to reach a potential closer to ground, triggering of the rail clamp 30 will result. FIG. 9 depicts the currents in devices 34, 35, 36 and 37, which determine the voltage of node INV1-OUT. Here we see the current conduction in transistor 37 but we also see that PMOS feedback transistor 34 is opposing this current flow. The net result is that node INV1-OUT soon returns to its tracking of the ramping of the rail VDD and the clamp is prevented from false triggering. FIG. 10 depicts the current flow in the ESD discharge transistor 31 which shows that a minimal value of current flows in this device during the intermediate state and that this value then decays to zero after the transient has resolved. Also notice (FIG. 8) that once the RC time constant has timed out, current flow in transistor 37 soon decays. If a much longer time constant were needed for ESD operation, then there would be a greater risk of triggering the clamp for a fast ramp time of the rail VDD, as transistor 37 would be trying to keep node INV1-OUT at ground for a longer period of time. Thus, the combination of a short time constant and feedback transistor 34 allows for very fast power supply ramp times to be used which is a very highly desirable feature of the invention described herein.

While this invention has been described with reference to an illustrative embodiment, this description is not intended to be construed in a limiting sense. Various modifications and combinations of the illustrative embodiment, as well as other embodiments of the invention, will be apparent to persons skilled in the art upon reference to the description. It is therefore intended that the appended claims encompass any such modifications or embodiments.

What is claimed is:

1. A circuit comprising:
   a first inverter having a high side supply node and a low side supply node;
   a second inverter having an input coupled to an output of the first inverter;
   a first feedback transistor coupled between the high side supply node and the output of the first inverter, and having a control node coupled to an output of the second inverter;
   a second feedback transistor connected between the low side supply node and the output of the first inverter, and having a control node coupled to the output of the second inverter; and
   an electrostatic discharge device having a control node coupled to the output of the second inverter.

2. The circuit of claim 1 wherein the electrostatic discharge device is coupled between the high side supply node and the low side supply node.

3. The circuit of claim 1 wherein the electrostatic discharge device is an electrostatic discharge transistor.

4. The circuit of claim 1 further comprising a timing circuit coupled to an input of the first inverter.

5. The circuit of claim 1 further comprising an RC circuit coupled to an input of the first inverter.

6. The circuit of claim 1 further comprising:
   a capacitor coupled between the high side supply node and an input of the first inverter; and
   a resistor coupled between the low side supply node and the input of the first inverter.

7. The circuit of claim 1 wherein the first and second inverters are CMOS inverters.

8. The circuit of claim 1 wherein the second inverter has a first supply node coupled to the high side supply node and a second supply node coupled to the low side supply node.

9. The circuit of claim 2 wherein the second inverter has a first supply node coupled to the high side supply node and a second supply node coupled to the low side supply node.

10. The circuit of claim 1 wherein the first feedback transistor is a PMOS transistor and the second feedback transistor is an NMOS transistor.

11. An electrostatic discharge protection circuit comprising:
    an electrostatic discharge device coupled between a first node and a second node;
    a first inverter;
    a second inverter having an input coupled to an output of the first inverter, and having an output coupled to a control node of the discharge device;
    a first feedback transistor coupled between the first node and the output of the first inverter, and having a control node coupled to the output of the second inverter; and
    a second feedback transistor connected between the second node and the output of the first inverter, and having a control node coupled to the output of the second inverter.

12. The circuit of claim 11 further comprising a timing circuit coupled to an input of the first inverter.

13. The circuit of claim 11 further comprising an RC circuit coupled to an input of the first inverter.

14. The circuit of claim 11 further comprising:
    a capacitor coupled between an input of the first inverter and the first node; and
    a resistor coupled between the input of the first inverter and the second node.

15. The circuit of claim 11 wherein the first and second inverters are CMOS inverters.

16. The circuit of claim 11 wherein the first inverter has a first supply terminal coupled to the first node and a second supply terminal coupled to the second node.

17. The circuit of claim 11 wherein the second inverter has a first supply terminal coupled to the first node and a second supply terminal coupled to the second node.

18. The circuit of claim 11 wherein the electrostatic discharge device is an electrostatic discharge transistor.

* * * * *